US012126366B2

(12) United States Patent
Kroekenstoel et al.

(10) Patent No.: US 12,126,366 B2
(45) Date of Patent: Oct. 22, 2024

(54) MULTI-MODE SIGMA-DELTA ADC CIRCUIT AND MICROPHONE CIRCUIT HAVING A MULTI-MODE SIGMA-DELTA ADC CIRCUIT

(71) Applicant: NXP B.V., Eindhoven (NL)

(72) Inventors: Dave Sebastiaan Kroekenstoel, Eindhoven (NL); Muhammad Kamran, Helmond (NL); Harry Neuteboom, Eindhoven (NL); Costantino Ligouras, Utrecht (NL); Sergio Andrés Rueda Gómez, Eindhoven (NL)

(73) Assignee: NXP B.V., Eindhoven (NL)

( * ) Notice: Subject to any disclaimer, the term of this patent is extended or adjusted under 35 U.S.C. 154(b) by 113 days.

(21) Appl. No.: 17/950,486

(22) Filed: Sep. 22, 2022

(65) Prior Publication Data

US 2024/0106455 A1    Mar. 28, 2024

(51) Int. Cl.
*H03M 3/00* (2006.01)
*H04R 3/00* (2006.01)
*H03M 1/12* (2006.01)

(52) U.S. Cl.
CPC ........... *H03M 3/484* (2013.01); *H03M 3/392* (2013.01); *H04R 3/00* (2013.01); *H03M 1/12* (2013.01); *H03M 3/354* (2013.01)

(58) Field of Classification Search
CPC ...... H03M 3/484; H03M 3/392; H03M 3/354; H03M 1/12; H04R 3/00
See application file for complete search history.

(56) References Cited

U.S. PATENT DOCUMENTS

| 5,012,244 A | 4/1991 | Wellard et al. |
| 5,159,341 A | 10/1992 | McCartney et al. |
| 7,382,300 B1 | 6/2008 | Nanda et al. |

(Continued)

FOREIGN PATENT DOCUMENTS

| EP | 2421156 A2 | 2/2021 |
| WO | WO-2021063874 A1 | 4/2021 |

OTHER PUBLICATIONS

Jeong, Donghyeok et al. "A 4-MHz Bandwidth Continuous-Time Sigma-Delta Modulator With Stochastic Quantizer and Digital Accumulator", IEEE Transactions on Circuits and Systems—II: Express Briefs, vol. 66, No. 7, Jul. 2019, pp. 1124-1128.

(Continued)

*Primary Examiner* — Joseph J Lauture

(57) ABSTRACT

Embodiments of multi-mode sigma-delta analog-to-digital converter (ADC) circuits and a microphone circuit are disclosed. In an embodiment, a multi-mode sigma-delta ADC circuit includes a pair of operational transconductance amplifiers (OTAs), a filter connected to the pair of OTAs, a quantizer connected to the filter, a differential digital-to-analog converter (DAC) connected to the quantizer, and a controller configured to switch the multi-mode sigma-delta ADC circuit between a single-ended operational mode, a pseudo differential operational mode, and a full differential operational mode to improve common mode rejection (CMR) performance by controlling the pair of OTAs. An output of a microphone and a differential output of the differential DAC are inputted into input terminals of the pair of OTAs.

20 Claims, 10 Drawing Sheets

(56) References Cited

U.S. PATENT DOCUMENTS

| | | |
|---|---|---|
| 8,319,674 B2 | 11/2012 | Loeda et al. |
| 8,736,473 B2 | 5/2014 | Dijkmans et al. |
| 8,963,755 B2 | 2/2015 | Pinna |
| 9,391,628 B1 | 7/2016 | Lyden et al. |
| 11,962,331 B2 | 4/2024 | van Veldhoven |
| 2010/0097258 A1* | 4/2010 | Koli .................. H03H 15/00 341/155 |
| 2011/0175761 A1 | 7/2011 | Zare-Hoseini |
| 2012/0038500 A1 | 2/2012 | Dijkmans et al. |
| 2013/0021183 A1 | 1/2013 | Ashburn, Jr. et al. |
| 2021/0126648 A1 | 4/2021 | Zhang et al. |
| 2022/0239305 A1 | 7/2022 | Schifmann et al. |

OTHER PUBLICATIONS

Peeters, Erik et al. "A fully differential 1.W low-power CMOS operational amplifier with a rail-to-rail current-regulated constant-g, input stage", IEEE 1997 Custom Integrated Circuits Conference, (1997), pp. 75-78.

Anonymous; "DA7219 Audio codec with Advanced Accessory Detect";Dec. 17, 2015; pp. 1-123.

de Aguirre, Paulo César, et al.; "A 170.7-dB FoM-DR 0.45/0.6-V Inverter-Based Continuous-Time Sigma-Delta Modulator"; IEEE Transactions on Circuits and Systems II: Express Briefs; vol. 67, No. 8; Aug. 2020, pp. 1384-1388.

Wang, Le et al.; "A Micropower Delta-Sigma Modulator based on a Self-Biased Super Inverter for Neural Recording Systems"; IEEE Custom Integrated Circuits Conference; Sep. 2010; 4 pages.

Fuldner, Marc et al.; "Dual Back Plate Silicon MEMS Microphone: Balancing High Performance!"; vol. 1; Mar. 16, 2015; pp. 41-43.

Kaliyath, Yajunath, et al.; "A 1. 8 V 11. 02 W Single-Ended Inverter-Based OTA with 113. 62 dB Gain"; 2016 IEEE Distributed Computing, VLSI, Electrical Circuits and Robotics (Discover);Aug. 13, 2016; pp. 237-241.

Nikas, Antonios et al.: "A Continuous-Time Delta-Sigma Modulator Using a Modified Instrumentation Amplifier and Current Reuse DAC for Neural Recording"; IEEE Journal of Solid-State Circuits; Oct. 2019; pp. 2879-2891; vol. 54, No. 10.

Christen, Thomas; "A 15-bit 140-µW Scalable-Bandwidth Inverter-Based Modulator for a MEMS Microphone With Digital Output"; Jul. 2013; pp. 1605-1614; vol. 48, No. 7.

U.S. Appl. No. 17/950,582, Kroekenstoel, Dave Sebastiaan: "Sigma-Delta ADC Circuit With Bias Compensation and Microphone Circuit Having a Sigma-Delta ADC Circuit With Bias Compensation"; filed Sep. 22, 2022.

U.S. Appl. No. 17/950,582, Kroekenstoel, Dave Sebastiaan; Notice of Allowance mailed on May 15, 2024; 16 pages.

\* cited by examiner

MULTI-MODE SIGMA-DELTA ADC CIRCUIT AND MICROPHONE CIRCUIT HAVING A MULTI-MODE SIGMA-DELTA ADC CIRCUIT

BACKGROUND

For low-power applications (e.g., low-power audio applications), an analog-to-digital converter (ADC) for converting analog signals from a microphone into digital information typically needs a high-ohmic input to reduce or avoid current drawn from the microphone. For example, for audio applications (e.g., hearing aid and earbud applications) in which short wires or cables are used, common mode noise for single-ended microphones is typically limited. However, for audio applications (e.g., gaming headsets) in which longer wires or cables are used with microphone and inputs including adaptive active noise canceling (ANC), common mode ripple rejection is important to reduce power consumption.

A sigma-delta (ΣΔ) ADC can provide high integration and low power consumption for various applications (e.g., audio applications). For example, a sigma-delta ADC can convert a microphone signal into a digital signal without a pre-amplifier and without drawing significant current from a microphone. However, when using a single ended input and ground as a differential input, the common mode rejection (CMR) is generally not optimal.

SUMMARY

Embodiments of multi-mode sigma-delta analog-to-digital converter (ADC) circuits and a microphone circuit are disclosed. In an embodiment, a multi-mode sigma-delta ADC circuit includes a pair of operational transconductance amplifiers (OTAs), a filter connected to the pair of OTAs, a quantizer connected to the filter, a differential digital-to-analog converter (DAC) connected to the quantizer, and a controller configured to switch the multi-mode sigma-delta ADC circuit between a single-ended operational mode, a pseudo differential operational mode, and a full differential operational mode to improve common mode rejection (CMR) performance by controlling the pair of OTAs. An output of a microphone and a differential output of the differential DAC are inputted into input terminals of the pair of OTAs. Other embodiments are also described.

In an embodiment, the microphone is a single-ended microphone.

In an embodiment, the controller is further configured to operate the multi-mode sigma-delta ADC circuit under the single-ended operational mode.

In an embodiment, the controller is further configured to disable a first OTA of the pair of OTAs and to enable a second OTA of the pair of OTAs.

In an embodiment, the controller is further configured to operate the multi-mode sigma-delta ADC circuit under the pseudo differential operational mode.

In an embodiment, the controller is further configured to enable each OTA of the pair of OTAs.

In an embodiment, wherein a component of the differential output of the differential DAC is constant.

In an embodiment, the component of the differential output of the differential DAC is equal to an input voltage to the multi-mode sigma-delta ADC circuit.

In an embodiment, the microphone is a differential microphone.

In an embodiment, the controller is further configured to operate the multi-mode sigma-delta ADC circuit under the full differential operational mode.

In an embodiment, the quantizer includes a one-bit quantizer and a digital integrator connected to the one-bit quantizer.

In an embodiment, the one-bit quantizer and the digital integrator are operated under the same clock signal.

In an embodiment, a multi-mode sigma-delta ADC circuit includes a pair of OTAs, a filter connected to the pair of OTAs, a quantizer connected to the filter, a differential digital-to-analog converter (DAC) connected to the quantizer, and a controller configured to switch the multi-mode sigma-delta ADC circuit between a single-ended operational mode, a pseudo differential operational mode, and a full differential operational mode to improve CMR performance by controlling the pair of OTAs. The DAC includes resistors and switches connected to the resistors, where an output of a microphone and a differential output of the differential DAC are inputted into input terminals of the pair of OTAs.

In an embodiment, the microphone is a single-ended microphone.

In an embodiment, the controller is further configured to disable a first OTA of the pair of OTAs and to enable a second OTA of the pair of OTAs under the single-ended operational mode.

In an embodiment, the controller is further configured to enable each OTA of the pair of OTAs under the pseudo differential operational mode.

In an embodiment, a component of the differential output of the differential DAC is constant under the pseudo differential operational mode.

In an embodiment, the microphone is a differential microphone, and the controller is further configured to operate the multi-mode sigma-delta ADC circuit under the full differential operational mode.

In an embodiment, the quantizer includes a one-bit quantizer and a digital integrator connected to the one-bit quantizer.

In an embodiment, a microphone circuit includes a microphone and a multi-mode sigma-delta ADC circuit connected to the microphone. The multi-mode sigma-delta ADC circuit includes a pair of OTAs, a filter connected to the pair of OTAs, a quantizer connected to the filter, a differential digital-to-analog converter (DAC) connected to the quantizer, and a controller configured to switch the multi-mode sigma-delta ADC circuit between a single-ended operational mode, a pseudo differential operational mode, and a full differential operational mode to improve CMR performance by controlling the pair of OTAs. An output of the microphone and a differential output of the differential DAC are inputted into a input terminals of the pair of OTAs.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
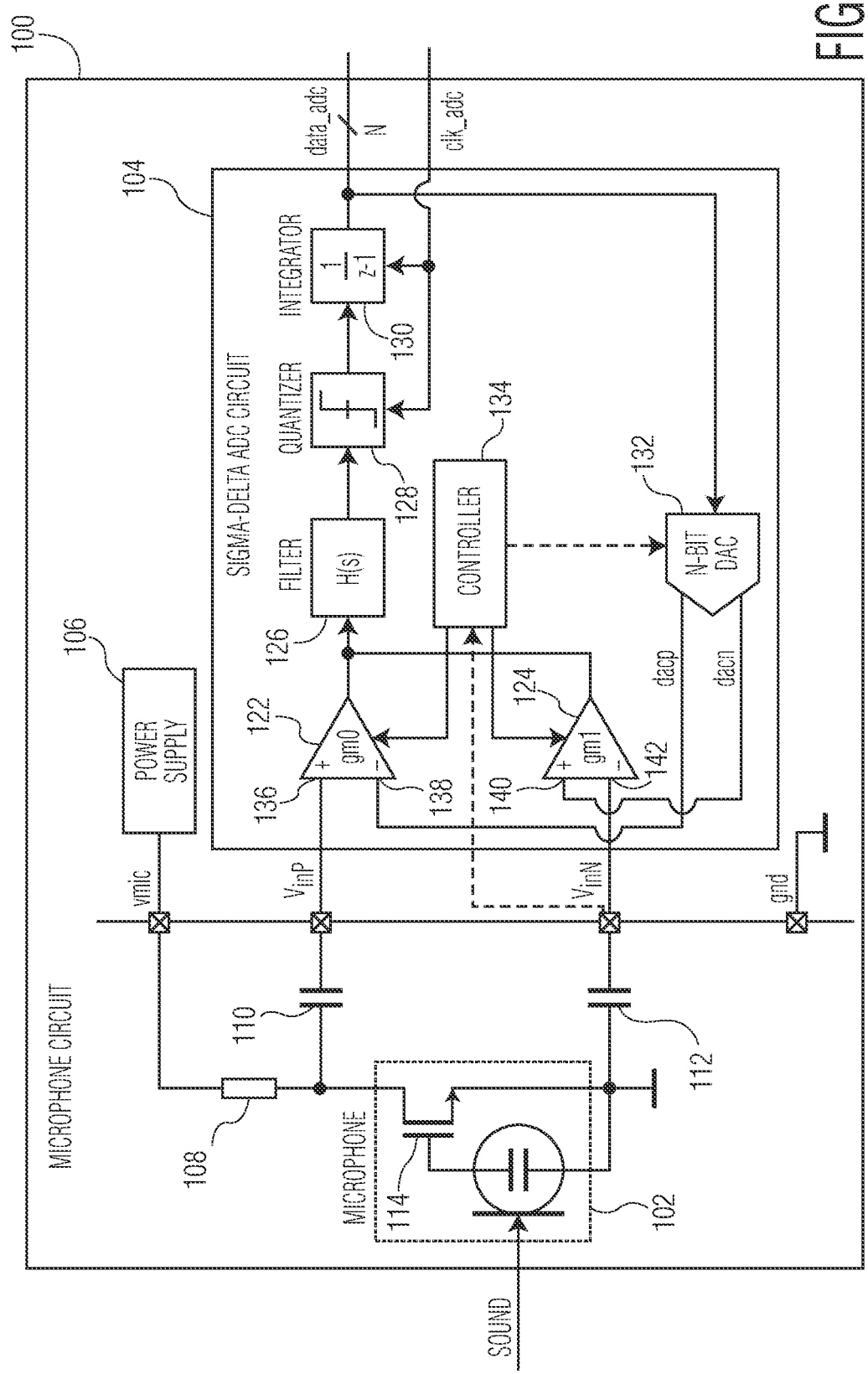
FIG. 1 is a schematic block diagram of a microphone circuit in accordance with an embodiment of the invention.

FIG. 1 is a schematic block diagram of a microphone circuit 100 in accordance with an embodiment of the invention. The microphone circuit can be used in various applications, such as audio applications, automotive applications, communications applications, and/or consumer or appliance applications. In the embodiment depicted in FIG. 1, the microphone circuit 100 includes a microphone 102 and a sigma-delta ($\Sigma\Delta$) ADC circuit 104. The sigma-delta ADC circuit 104 can convert analog signals from the microphone 102 into digital information. The microphone circuit 100 can be implemented in at least one substrate, such as at least one semiconductor wafer. In an embodiment, the microphone circuit 100 or a component of the microphone circuit is packaged as a stand-alone integrated circuit (IC) chip. For example, the microphone 102 and the sigma-delta ADC circuit 104 are located on the same IC chip. In some embodiments, the microphone 102 and the sigma-delta ADC circuit 104 are located in close proximity but in different IC chips. Although the microphone circuit 100 is shown in FIG. 1 as including certain circuit elements, in other embodiments, the microphone circuit may include one or more additional circuit elements. For example, the microphone circuit may include a power supply 106 configured to provide an output having a voltage, $V_{MIC}$, to the microphone 102. In another example, the microphone circuit includes a resistor 108 and capacitors 110, 112 that are connected between the microphone 102, the sigma-delta ADC circuit 104, and/or the power supply 106. The capacitors 110, 112 can translate the DC level of the microphone 102 into a more suitable DC level for the sigma-delta ADC circuit 104.

In the embodiment depicted in FIG. 1, the microphone 102 is a transducer configured to convert sound into an analog signal, for example, by converting the air pressure variations of a sound wave to an electrical signal. The microphone 102 can be any type of microphone. For example, the microphone 102 is a dynamic microphone that may use a coil of wire suspended in a magnetic field. In another example, the microphone 102 is a condenser microphone that may use a vibrating diaphragm as a capacitor plate. In another example, the microphone 102 is a contact microphone that may use a crystal of piezoelectric material. In some embodiments, the microphone 102 includes an amplifier 114 configured to amplify analog signals that are generated by the microphone 102. The amplifier 114 may be implemented as a transistor or other semiconductor device. In some embodiments, the microphone 102 is a single-ended microphone, such as, an Electret Condenser Microphone (ECM) or a Microelectromechanical systems (MEMS) Microphone, which has a single-ended output voltage. In these embodiments, the microphone 102 generates a negative output, VinN, which is common mode noise, and a positive output, VinP, which is the combination of the common mode noise and a single-ended output voltage, which are inputted into a differential input stage that is formed by operational transconductance amplifiers (OTAs) 122, 124. In some embodiments, the microphone 102 is a differential microphone that generates a differential output voltage. A negative output, VinN, and a positive output, VinP, which are inputted into a differential input stage that is formed by the OTAs 122, 124.

In the embodiment depicted in FIG. 1, the sigma-delta ADC circuit 104 converts analog audio signals from the microphone 102 into a digital output, "data_adc." In the embodiment depicted in FIG. 1, the sigma-delta ADC circuit 104 includes the OTAs 122, 124 with transconductance, gm0, gm1, respectively, a filter 126, a quantizer 128, a digital integrator 130, a differential digital-to-analog converter (DAC) 132, and a controller 134. In an embodiment, the sigma-delta ADC circuit 104 is packaged as a stand-alone IC chip. For example, the OTAs 122, 124, the filter 126, the quantizer 128, the digital integrator 130, the differential DAC 132, and the controller 134 are located on the same IC chip. Although the sigma-delta ADC circuit 104 is shown in FIG. 1 as including certain circuit elements, in other embodiments, the sigma-delta ADC circuit 104 may include more or less circuit elements. For example, the sigma-delta ADC circuit 104 may include a clock source configured to generate a clock signal, clk_adc, for one or more components (e.g., the quantizer 128 and the digital integrator 130) of the sigma-delta ADC circuit 104. In another example, the controller 134 is external to the sigma-delta ADC circuit 104.

The sigma-delta ADC circuit 104 depicted in FIG. 1 can provide high integration and low power consumption for audio applications. For example, the sigma-delta ADC circuit 104 can convert analog audio signals from the microphone 102 into digital output without a pre-amplifier and without drawing significant current from the microphone 102. In the embodiment depicted in FIG. 1, the OTAs 122, 124 of the sigma-delta ADC circuit 104 form a differential input stage that allows common mode noise from the microphone 102 to be applied to differential input terminals 136, 138, 140, 142 of the OTAs 122, 124. Consequently, regardless of whether the microphone 102 is a single-ended microphone or a differential microphone, the sigma-delta ADC circuit 104 has better common mode rejection (CMR) performance than a typical single-ended sigma-delta ADC circuit. For example, as depicted in FIG. 1, outputs from the microphone 102 and feedback signals from the differential DAC 132 are inputted into differential input terminals 136, 138, 140, 142 of the OTAs 122, 124. Specifically, a positive input, VinP, from the microphone 102, after capacitor 110 and a positive feedback signal, dacp, from the differential DAC 132 are inputted into positive (non-inverting) and negative (inverting) terminals 136, 138 of the OTA 122. A negative input, VinN, from the microphone 102, after capacitor 112 and a negative feedback signal, dacn, from the differential DAC 132 are inputted into positive (non-inverting) and negative (inverting) terminals 140, 142 of the OTA 124. Each of the OTAs 122, 124 may be a single-ended OTA with a single output terminal or a full-differential OTA with two output terminals. Outputs from the OTAs 122, 124 are inputted into the filter 126. The positive feedback signal, dacp, and the negative feedback signal, dacn, from the differential DAC 132 follow the positive input, VinP, and the negative input, VinN. Consequently, the differential signals at the differential input terminals 136, 138, 140, 142 of the OTAs 122, 124 can remain as small as 1 least significant bit (LSB) of the output of the differential DAC 132. The common mode voltage follows the positive input, VinP, and the negative input, VinN, and goes rail-to-rail. Consequently, positive aspects (e.g., high-ohmic input) of a single-ended solution are maintained, while a differential input stage is combined. The OTAs 122, 124 together with the rest of the sigma-delta ADC circuit 104 (e.g., the filter 126) create a low-pass behavior for signal path and shape quantization noise to high frequencies, which can be filtered in a decimation/low-pass digital filter (not shown). For example, the OTAs 122, 124 and the filter 126 can form a loop filter. Compared to an ADC circuit that uses a variable gain amplifier (VGA) to map an input signal towards the input range of the ADC, the sigma-delta ADC circuit 104 depicted in FIG. 1 has better noise performance and lower audible artifacts, such as, direct current (DC) offset clicks. Further, compared to a sigma-delta ADC circuit that uses an active resistor-capacitor (RC) stage to implement a virtual ground configuration the sigma-delta ADC circuit 104 depicted in FIG. 1 has reduced power consumption; and compared to a sigma-delta ADC circuit that uses OTA-capacitor (gm-C) input stage configuration, circuit 104 has better Total Harmonic Distortion (THD), which is the distortion that occurs on harmonics of an original signal.

The sigma-delta ADC circuit 104 depicted in FIG. 1 can switch between different operational modes. In some embodiments, the sigma-delta ADC circuit 104 switches between a single-ended operational mode, a pseudo differential operational mode, and a full differential operational mode, for example, based on the type of the microphone 102. For example, the sigma-delta ADC circuit 104 can operate under the single-ended operational mode or under the pseudo differential operational mode when the microphone 102 is a single-ended microphone and operate under full differential operational mode when the microphone 102 is a differential microphone. Compared to a typical single-ended sigma-delta ADC circuit, the sigma-delta ADC circuit 104 depicted in FIG. 1 can accommodate a single-ended microphone or a differential microphone. In addition, compared to a typical single-ended sigma-delta ADC circuit, the sigma-delta ADC circuit 104 depicted in FIG. 1 can provide a differential input stage for a single-ended microphone and a better common mode rejection (CMR) performance. In some embodiments, the sigma-delta ADC circuit 104 is configured to operate under the single-ended operational mode, for example, by disabling or deactivating the OTA 124 and enabling or activating the OTA 122. The single-ended operational mode is the most low-power operational mode for applications in which there is minimal or no common mode ripple, e.g., when microphone wires are short (e.g., for hearing-aid or earbuds applications). In some embodiments, the sigma-delta ADC circuit 104 is configured to operate under the pseudo differential operational mode, for example, by enabling or activating the OTAs 122, 124. Under the pseudo differential operational mode, the microphone 102 is a single-ended microphone and the negative output, dacn, of the differential DAC 132 is constant and is equal to an input voltage, VinN, to the sigma-delta ADC circuit 104 (i.e., an input voltage to an inverting terminal 142 of the OTA 124). In this configuration, Common Mode Rejection (CMR) performance of the sigma-delta ADC circuit 104 is improved. In some embodiments, the sigma-delta ADC circuit 104 is configured to operate under the full differential operational mode by enabling or activating the OTAs 122, 124. Under the full differential operational mode, the microphone 102 is a differential microphone and the differential DAC 132 operates in full differential mode. In this configuration, CMR performance of the sigma-delta ADC circuit 104 is further improved.

In the embodiment depicted in FIG. 1, the filter 126 is configured to perform signal filtering of the outputs from the OTAs 122, 124 to generate filtered signals, which are inputted into the quantizer 128.

In the embodiment depicted in FIG. 1, the quantizer 128 is configured to perform a quantization function to the filtered signals from the filter 126 to generate a quantization result. For example, the quantizer 128 may map continuous infinite signal amplitude values (e.g., voltage levels) to a smaller set of discrete finite values. In some embodiments, a time-varying voltage signal is sampled into a discrete-time signal with a sequence of real numbers, and each real number is replaced with an approximation from a finite set of discrete values. In some embodiments, the quantizer 128 is a one-bit quantizer that has 2 levels.

In the embodiment depicted in FIG. 1, the digital integrator 130 is configured to perform an integration function to the quantization result from the quantizer 128 to generate the digital signal, data_adc, which is outputted from the sigma-delta ADC circuit 104. In some embodiments, the quantizer 128 and the digital integrator 130 are operated under the same clock signal, clk_adc, which is generated by a clock source. In some embodiments, the quantizer 128 and the digital integrator 130 form a multi-bit quantizer.

In the embodiment depicted in FIG. 1, the differential DAC 132 is configured to convert the digital signal, data_adc into a differential analog output having positive and negative analog components, "dacp," and "dacn," which are applied to the OTAs 122, 124.

In the embodiment depicted in FIG. 1, the controller 134 is configured to control the operation of the sigma-delta ADC circuit 104. The controller 134 may be implemented as at least one processor (e.g., a microcontroller, a digital signal processor (DSP), and/or a central processing unit (CPU)). In the embodiment depicted in FIG. 1, the controller 134 is configured to switch the sigma-delta ADC circuit 104 between a single-ended operational mode, a pseudo differential operational mode, and a full differential operational mode, for example, by disabling or deactivating the OTA 122 and/or the OTA 124. By switching between the single-ended operational mode, the pseudo differential operational mode, and the full differential operational mode, the sigma-delta ADC circuit 104 depicted in FIG. 1 can accommodate a single-ended microphone or a differential microphone. In addition, the sigma-delta ADC circuit 104 depicted in FIG. 1 can provide a differential input stage for a single-ended microphone and a better common mode rejection (CMR) performance. In some embodiments, the controller 134 is configured to generate one or more control signals (e.g., enablement or disablement signals) to control the OTA 122 and/or the OTA 124, for example, based on input signals from the microphone 102 (e.g., based on whether the microphone 102 is a single-ended microphone or a differential microphone). For example, the controller may generate one or more control signals (e.g., enablement or disablement signals) to control the OTA 122 and/or the OTA 124, for example, based on whether the microphone 102 is a single-ended microphone or a differential microphone. In some embodiments, the controller 134 is configured to control the differential DAC 132, for example, to control the differential DAC 132 to operate in a differential mode or a single-ended mode (e.g., by disabling one output or controlling one output of the differential DAC 132).

In the embodiment depicted in FIG. 1, the controller 134 is configured to operate the sigma-delta ADC circuit 104 under the single-ended operational mode by disabling or deactivating the OTA 124 and enabling or activating the OTA 122. When the sigma-delta ADC circuit 104 operates under the single-ended operational mode, the microphone 102 is a single-ended microphone. The single-ended operational mode is the most low-power operational mode for applications in which there is low or no common mode ripple, e.g., when microphone wires are very short (e.g., for hearing-aid or earbuds applications).

In the embodiment depicted in FIG. 1, the controller 134 is configured to operate the sigma-delta ADC circuit 104 under the pseudo differential operational mode by enabling or activating the OTAs 122, 124. When the sigma-delta ADC circuit 104 operates under the pseudo differential operational mode, the microphone 102 is a single-ended microphone and the negative output, dacn, of the differential DAC 132 is constant and is equal to the input voltage, VinN, at the output of the microphone 102. In this configuration, CMR performance of the sigma-delta ADC circuit 104 can be improved.

In the embodiment depicted in FIG. 1, the controller 134 is configured to operate the sigma-delta ADC circuit 104 in the full differential operational mode by enabling or activating the OTAs 122, 124. When the sigma-delta ADC circuit 104 operates under the full differential operational mode, the microphone 102 is a differential microphone. Under the full differential operational mode, the differential DAC 132 operates in full differential mode. In this configuration, CMR performance of the sigma-delta ADC circuit 104 can be further improved.

Figure 2:
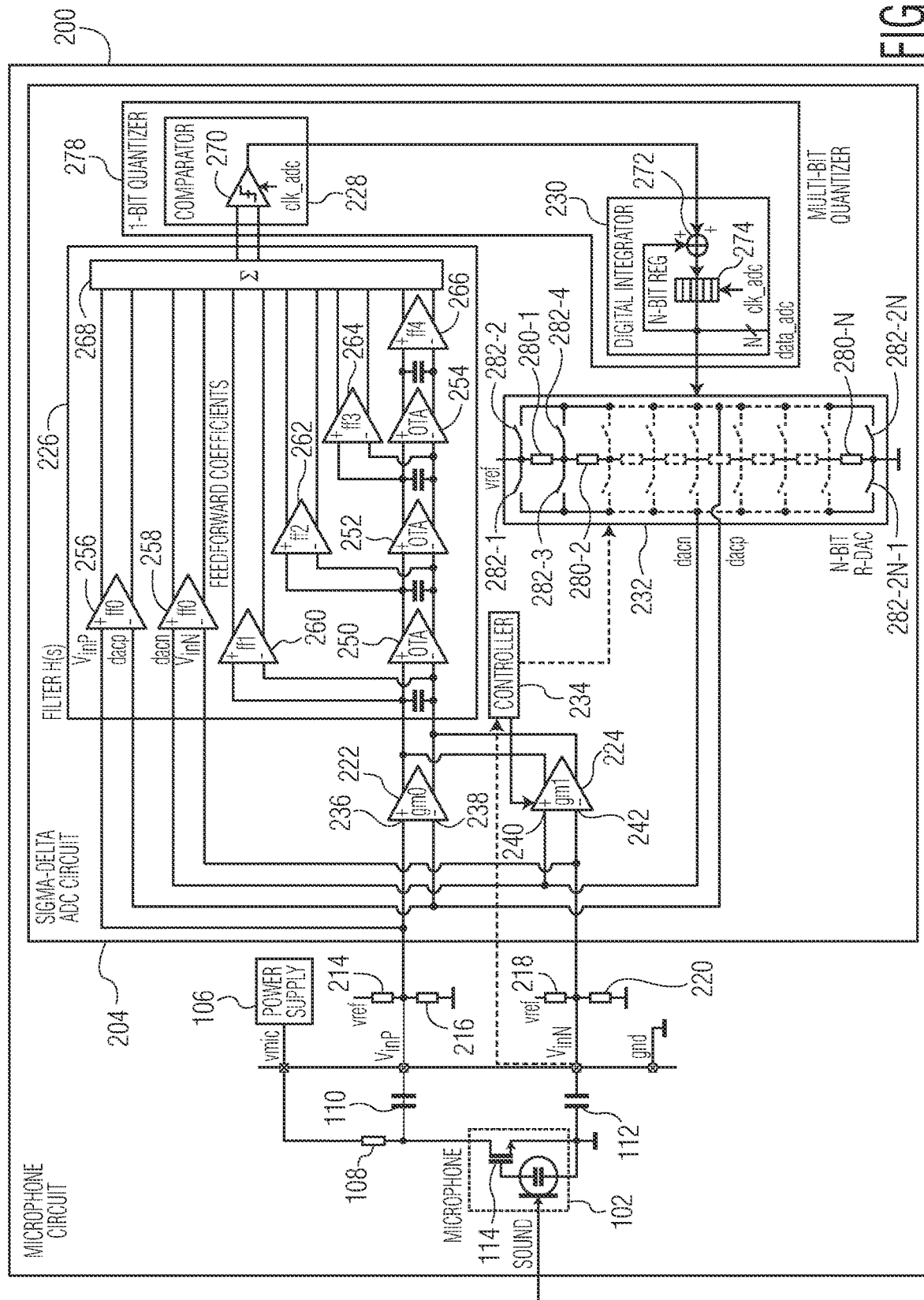
FIG. 2 depicts an embodiment of the microphone circuit depicted in FIG. 1.

FIG. 2 depicts a microphone circuit 200, which is an embodiment of the microphone circuit 100 depicted in FIG. 1. However, the microphone circuit 100 depicted in FIG. 1 is not limited to the embodiment depicted in FIG. 2. In the embodiment depicted in FIG. 2, the microphone circuit 200 includes the microphone 102 and a sigma-delta ADC circuit 204, which is an embodiment of the sigma-delta ADC circuit 104 depicted in FIG. 1. The sigma-delta ADC circuit 204 can convert analog signals from the microphone 102 into digital information. In an embodiment, the microphone circuit 200 or a component of the microphone circuit is packaged as a stand-alone IC chip. For example, the microphone 102 and the sigma-delta ADC circuit 204 are located on the same IC chip. In some embodiments, the microphone 102 and the sigma-delta ADC circuit 204 are located in close proximity but in different IC chips. Although the microphone circuit 200 is shown in FIG. 1 as including certain circuit elements, in other embodiments, the microphone circuit may include one or more additional circuit elements. For example, the microphone circuit 200 may include the power supply 106 configured to provide an output signal having a voltage, $V_{MIC}$, to the microphone 102. In another example, the microphone circuit includes the resistor 108 and the capacitors 110, 112 that are connected between the microphone 102, the sigma-delta ADC circuit 204, and/or the power supply 106, and resistors 214, 216, 218, 220 that are connected to a reference voltage, Vref, or the ground. The capacitors 110, 112 can translate the DC level of the microphone 102 into a more suitable DC level for the sigma-delta ADC circuit 104, such that positive and negative voltages, VinP, VinN are within the correct range for the sigma-delta ADC circuit 204, defined by the resistors 214, 216, 218, 220, and the reference voltage, Vref.

In the embodiment depicted in FIG. 2, the sigma-delta ADC circuit 204 converts analog audio signals from the microphone 102 into a digital output, data_adc. In the embodiment depicted in FIG. 2, the sigma-delta ADC circuit 204 includes full-differential OTAs 222, 224 with transconductance, gm0, gm1, respectively, a filter 226, a quantizer 228, a digital integrator 230, a differential DAC 232, and a controller 234. The OTAs 222, 224, the filter 226, the quantizer 228, the digital integrator 230, the differential DAC 232, and the controller 234 of the sigma-delta ADC circuit 204 depicted in FIG. 2 are embodiments of the OTAs 122, 124, the filter 126, the quantizer 128, the digital integrator 130, the differential DAC 132, and the controller 134 of the sigma-delta ADC circuit 104 depicted in FIG. 1. In an embodiment, the sigma-delta ADC circuit 204 is packaged as a stand-alone IC chip. For example, the OTAs 222, 224, the filter 226, the quantizer 228, the digital integrator 230, the differential DAC 232, and the controller 234 are located on the same IC chip. Although the sigma-delta ADC circuit 204 is shown in FIG. 2 as including certain circuit elements, in other embodiments, the sigma-delta ADC circuit 204 may include more or less circuit elements. For example, the sigma-delta ADC circuit 204 may include a clock source configured to generate a clock signal, clk_adc, for one or more components (e.g., the quantizer 228 and the digital integrator 230) of the sigma-delta ADC circuit 204. In another example, the controller 234 is external to the sigma-delta ADC circuit 204.

The sigma-delta ADC circuit 204 depicted in FIG. 2 can provide high integration and low power consumption for audio applications. For example, the sigma-delta ADC circuit 204 can convert analog audio signals from the microphone 102 into digital output without a pre-amplifier and without drawing significant current from the microphone 102. In the embodiment depicted in FIG. 2, the OTAs 222, 224 of the sigma-delta ADC circuit 204 form a differential input stage that allows common mode noise from the microphone 102 to be applied to differential input terminals 236, 238, 240, 242 of the OTAs 222, 224. Consequently, regardless of whether the microphone 102 is a single-ended microphone or a differential microphone, the sigma-delta ADC circuit 204 has better common mode rejection (CMR) performance than a typical single-ended sigma-delta ADC circuit. For example, as depicted in FIG. 2, outputs from the microphone 102 and feedback signals from the differential DAC 232 are inputted into differential input terminals 236, 238, 240, 242 of the OTAs 222, 224. Specifically, a positive input, VinP, from the microphone 102, after capacitor 110 and a positive feedback signal, dacp, from the differential DAC 232 are inputted into positive (non-inverting) and negative (inverting) terminals 236, 238 of the OTA 222. A negative input, VinN, from the microphone 102, after capacitor 112 and a negative feedback signal, dacn, from the differential DAC 232 are inputted into positive (non-inverting) and negative (inverting) terminals 240, 242 of the OTA 224. Each of the OTAs 222, 224 may be a full-differential OTA with two output terminals. Outputs from the OTAs 222, 224 are inputted into the filter 226. The positive feedback signal, dacp, and the negative feedback signal, dacn, from the differential DAC 232 follow the positive input, VinP, and the negative input, VinN. Consequently, the differential signals at the differential input terminals 236, 238, 240, 242 of the OTAs 222, 224 can remain as small as 1 least significant bit (LSB) of the output of the differential DAC 232. The common mode voltage follows the positive input, VinP, and the negative input, VinN, and goes rail-to-rail. Consequently, positive aspects (e.g., high-ohmic input) of a single-ended solution are maintained, while a differential input stage is combined. The OTAs 222, 224 and the filter 226 create a low-pass behavior for signal path and shape quantization noise to high frequencies, which can be filtered in a decimation/low-pass digital filter (not shown).

The sigma-delta ADC circuit 204 depicted in FIG. 2 can switch between different operational modes. In some embodiments, the sigma-delta ADC circuit 204 switches between a single-ended operational mode, a pseudo differential operational mode, and a full differential operational mode, for example, based on the type of the microphone 102. For example, the sigma-delta ADC circuit 204 can operate under the single-ended operational mode or under the pseudo differential operational mode when the microphone 102 is a single-ended microphone and operate under full differential operational mode when the microphone 102 is a differential microphone. Compared to a typical single-ended sigma-delta ADC circuit, the sigma-delta ADC circuit 204 depicted in FIG. 2 can accommodate a single-ended microphone or a differential microphone. In addition, compared to a typical single-ended sigma-delta ADC circuit, the sigma-delta ADC circuit 204 depicted in FIG. 2 can provide a differential input stage for a single-ended microphone and a better common mode rejection (CMR) performance. In some embodiments, the sigma-delta ADC circuit 204 is configured to operate under the single-ended operational mode, for example, by disabling or deactivating the OTA 224 and enabling or activating the OTA 222. The single-ended operational mode is the most low-power operational mode for applications in which there is minimal or no common mode ripple, e.g., when microphone wires are short (e.g., for hearing-aid or earbuds applications). In some embodiments, the sigma-delta ADC circuit 204 is configured to operate under the pseudo differential operational mode, for example, by enabling or activating the OTAs 222, 224. Under the pseudo differential operational mode, the microphone 102 is a single-ended microphone and the negative output, dacn, of the differential DAC 232 is constant and is equal to the input voltage, VinN, at the output of the capacitor 110. In this configuration, CMR performance of the sigma-delta ADC circuit 204 is improved. In some embodiments, the sigma-delta ADC circuit 204 is configured to operate under the full differential operational mode by enabling or activating the OTAs 222, 224. Under the full differential operational mode, the microphone 102 is a differential microphone and the differential DAC 232 operates in full differential mode. In this configuration, CMR performance of the sigma-delta ADC circuit 204 is further improved.

In the embodiment depicted in FIG. 2, the filter 226 is configured to perform signal filtering of the outputs from the OTAs 222, 224 to generate filtered signals, which are inputted into the quantizer 228. In the embodiment depicted in FIG. 2, the filter 226 includes full-differential OTAs 250, 252, 254, 256, 258, 260, 262, 264, 266 and an analog adder circuit 268.

In the embodiment depicted in FIG. 2, the quantizer 228 is configured to perform a quantization function to the filtered signals from the filter 226 to generate a quantization result. In the embodiment depicted in FIG. 2, the quantizer 228 is a one-bit quantizer that has 2 levels and is implemented as a comparator 270. In the embodiment depicted in FIG. 2, the digital integrator 230 is configured to perform an integration function to the quantization result from the quantizer 228 to generate the digital signal, data_adc, which is outputted from the sigma-delta ADC circuit 204. In the embodiment depicted in FIG. 2, the digital integrator 230 includes a digital adder 272 and a register 274. In some embodiments, the quantizer 228 and the digital integrator 230 are operated under the same clock signal, clk_adc, which is generated by a clock source. In the embodiment depicted in FIG. 2, the quantizer 228 and the digital integrator 230 form a multi-bit quantizer 278.

In the embodiment depicted in FIG. 2, the differential DAC 232 is configured to convert the digital signal, data_adc into a differential analog output having positive and negative analog components, "dacp," and "dacn," which are applied to the OTAs 222, 224. In the embodiment depicted in FIG. 2, the differential DAC 232 is a resistive divider that includes resistors 280-1, . . . , 280-N, and switches 282-1, . . . , 282-2N, where N is a positive integer.

In the embodiment depicted in FIG. 2, the controller 234 is configured to control the operation of the sigma-delta ADC circuit 204. The controller 234 may be implemented as at least one processor (e.g., a microcontroller, a DSP, and/or a CPU). In the embodiment depicted in FIG. 2, the controller 234 is configured to switch the sigma-delta ADC circuit 204 between a single-ended operational mode, a pseudo differential operational mode, and a full differential operational mode, for example, by disabling or deactivating the OTA 222 and/or the OTA 224. By switching between the single-ended operational mode, the pseudo differential operational mode, and the full differential operational mode, the sigma-delta ADC circuit 204 depicted in FIG. 2 can accommodate a single-ended microphone or a differential microphone. In addition, the sigma-delta ADC circuit 204 depicted in FIG. 2 can provide a differential input stage for a single-ended microphone and a better common mode rejection (CMR) performance. For example, the controller 234 operates the sigma-delta ADC circuit 204 under the single-ended operational mode by disabling or deactivating the OTA 224 and enabling or activating the OTA 222. In some embodiments, the controller 234 is configured to generate one or more control signals (e.g., enablement or disablement signals) to control the OTA 222 and/or the OTA 224, for example, based on input signals from the microphone 102 (e.g., based on whether the microphone 102 is a single-ended microphone or a differential microphone). For example, the controller may generate one or more control signals (e.g., enablement or disablement signals) to control the OTA 222 and/or the OTA 224, for example, based on whether the microphone 102 is a single-ended microphone or a differential microphone. In some embodiments, the controller 234 is configured to control the differential DAC 232, for example, to control the differential DAC 232 to operate in a differential mode or a single-ended mode (e.g., by disabling one output or controlling one output of the differential DAC 232). When the sigma-delta ADC circuit 204 operates under the single-ended operational mode, the microphone 102 is a single-ended microphone. The single-ended operational mode is the most low-power operational mode for applications in which there is low or no common mode ripple, e.g., when microphone wires are very short (e.g., for hearing-aid or earbuds applications). In another example, the controller 234 operates the sigma-delta ADC circuit 204 under the pseudo differential operational mode by enabling or activating the OTAs 222, 224. When the sigma-delta ADC circuit 204 operates under the pseudo differential operational mode, the microphone 102 is a single-ended microphone and the negative output, dacn, of the differential DAC 232 is constant and is equal to the input voltage, VinN, at the output of the capacitor 110. In this configuration, CMR performance of the sigma-delta ADC circuit 204 can be improved. In another example, the controller 234 operates the sigma-delta ADC circuit 204 in the full differential operational mode by enabling or activating the OTAs 222, 224. When the sigma-delta ADC circuit 204 operates under the full differential operational mode, the microphone 102 is a differential microphone. Under the full differential operational mode, the differential DAC 232 operates in full differential mode. In this configuration, CMR performance of the sigma-delta ADC circuit 204 can be further improved.

Figure 3:
FIG. 3 illustrates example Total Harmonic Distortion Plus Noise (THD+N) plots of a sigma-delta ADC circuit of the microphone circuit depicted in FIG. 2 under a single-ended operational mode, a pseudo differential operational mode, and a full differential operational mode.

FIG. 3 illustrates example Total Harmonic Distortion Plus Noise (THD+N) plots 310, 320, 330 of the sigma-delta ADC circuit 204 of the microphone circuit 200 depicted in FIG. 2 under the single-ended operational mode, the pseudo differential operational mode, and the full differential operational mode. THD is the distortion that occurs on harmonics of an original signal, while noise is the more random, uncorrelated distortion. THD+N the combination of THD and noise, under presence of a 6 kHz common mode ripple frequency with 1 mVpk amplitude. This common mode ripple can be seen as a deterministic noise. In the examples depicted in FIG. 3, 1 kHz signal frequency and a 6 kHz ripple frequency with 1 mVpk amplitude are used. Full-scale (FS) may be equal to 900 mV single-ended, and 1.8V differential. 1 mVpk ripple can cause significant degradation to the THD+N performance. Under the full differential operational mode, the sigma-delta ADC circuit 204 has a performance (shown in plot 330) that is relatively flat over the entire range of signal amplitude. Under the pseudo differential operational mode, the sigma-delta ADC circuit 204 has a performance (shown in plot 320) that is relatively flat over low signal amplitude, but for high amplitudes it still is degraded. However, for the entire range of the signal amplitude, the performance (shown in plot 320) of the sigma-delta ADC circuit 204 under the pseudo differential operational mode remains significantly better than the performance (shown in plot 310) of the sigma-delta ADC circuit 204 under the single-ended operational mode. The performance of the sigma-delta ADC circuit 204 for lower amplitudes (e.g., <−10 dBFS) may be limited by second-order circuit imperfections.

In some embodiments, further performance optimization is implemented for applications in which the OTA pair (e.g., the OTAs 122, 124 of the sigma-delta ADC circuit 104 depicted in FIG. 1 or the OTAs 222, 224 of the sigma-delta ADC circuit 204 depicted in FIG. 2) is enabled and a single-ended microphone is used (i.e., the microphone 102 depicted in FIG. 1 is a single-ended microphone). For example, further performance optimization can be implemented for the sigma-delta ADC circuit 104 depicted in FIG. 1 or the sigma-delta ADC circuit 204 depicted in FIG. 2 in the pseudo differential operational mode. In another example, further performance optimization can be implemented for a sigma-delta ADC circuit that does not have multiple operational modes (e.g., no controller (e.g., the controller 134 depicted in FIG. 1 or the controller 234 depicted in FIG. 2) is implemented for switching a sigma-delta ADC circuit between multiple operational modes).

Figure 4:
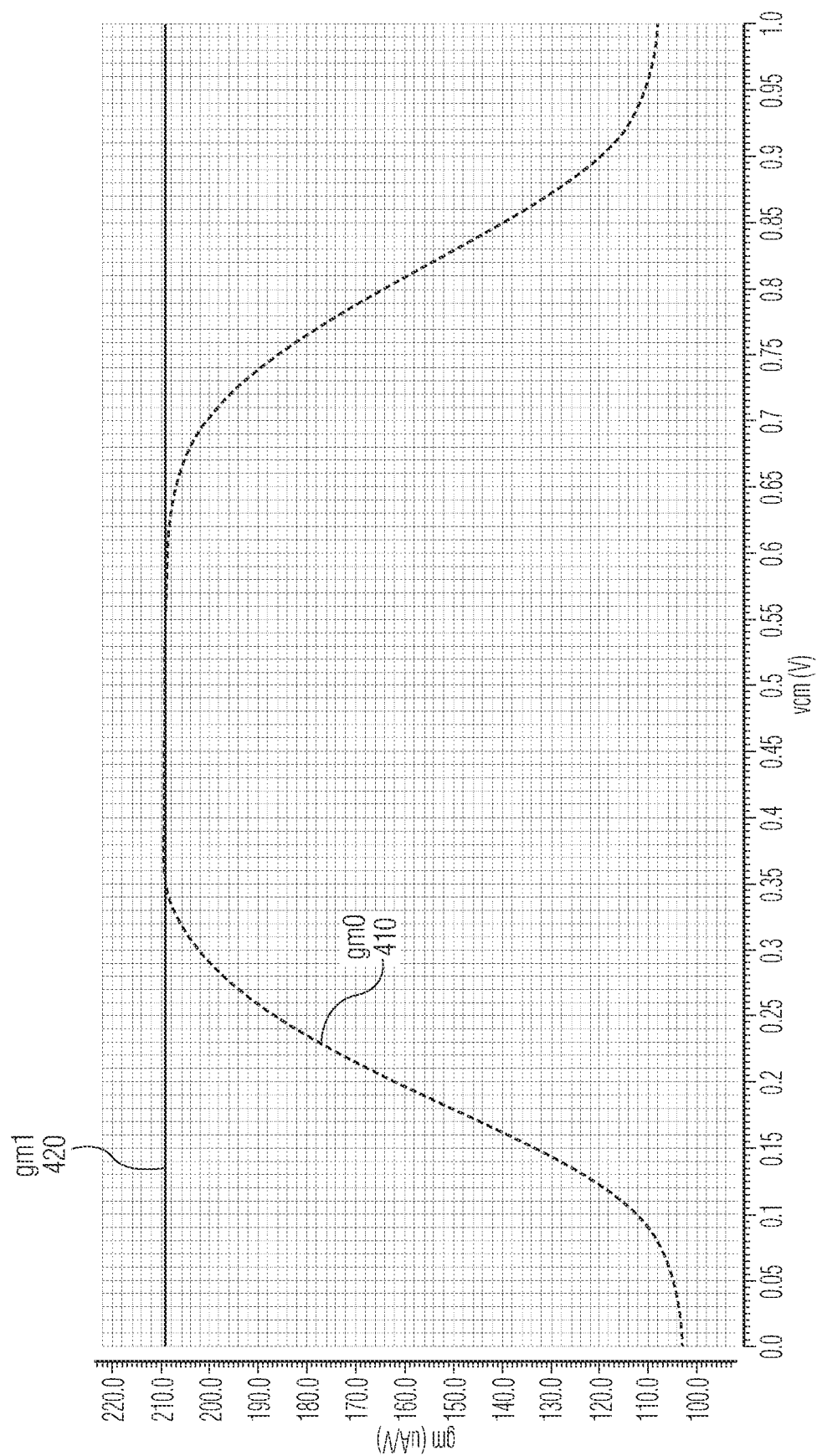
FIG. 4 illustrates example plots of amplifier transconductance versus a common mode input voltage of the sigma-delta ADC circuit of the microphone circuit depicted in FIG. 2.

When the signal amplitude at VinP increases, a differential pair may go out of saturation, and the transconductance (gm0) of the OTA 222 depicted in FIG. 2 decreases about 50%. However, in the pseudo differential operational mode, the transconductance (gm1) of the OTA 224 depicted in FIG. 2 stays constant, because both of the signals, dacn, and VinN remain constant for a signal-ended microphone. FIG. 4 illustrates example plots 410, 420 of amplifier transconductance (gm0 and gm1) of the OTAs 222, 224 versus common mode input voltage of the sigma-delta ADC circuit 204 of the microphone circuit 200 depicted in FIG. 2. In the examples depicted in FIG. 4, the transconductance (gm0 and gm1) of the OTAs 222, 224 are not equal.

A common mode ripple is equal for both the voltage, VinP, and the voltage, VinN. The signals, dacp, and, dacn, follow the voltage, VinP, and the voltage, VinN, respectively, and its difference is multiplied with the transconductances (gm0 and gm1) of the OTA 222, 224, respectively. When the transconductances (gm0 and gm1) of the OTA 222, 224 are equal, a common signal at VinP and VinN is subtracted, and therefore not converted to digital. When the transconductances (gm0 and gm1) of the OTA 222, 224 are not equal, a non-ideal subtraction can occur, and some residue error can be present in the converted digital signal at the output of the sigma-delta ADC circuit 204.

Figure 5:
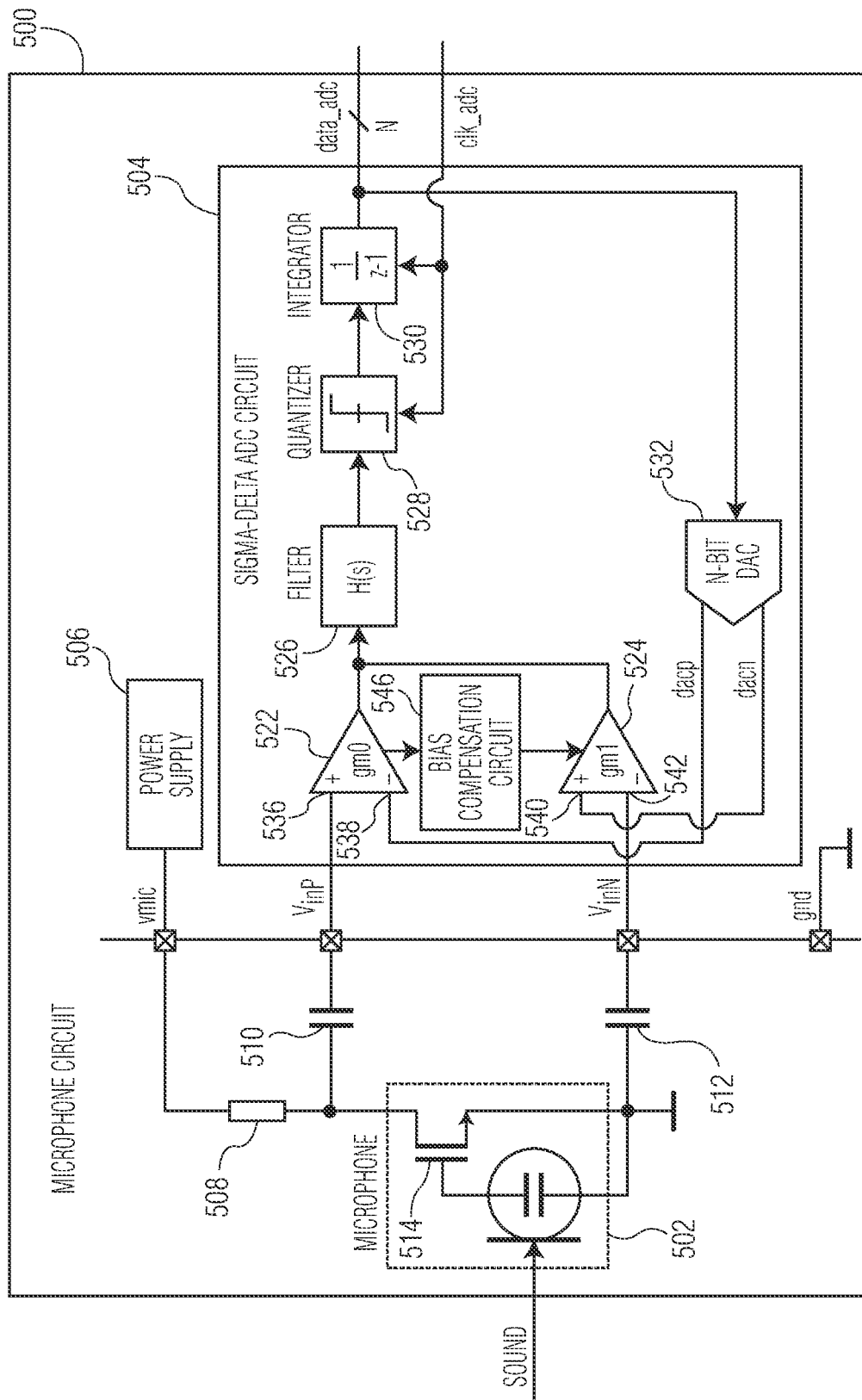
FIG. 5 is a schematic block diagram of a microphone circuit with bias compensation in accordance with an embodiment of the invention.

In some embodiments, bias compensation between OTAs is implemented in the differential OTA input pair of a sigma-delta ADC circuit to reduce Total Harmonic Distortion Plus Noise (THD+N) for a single-ended microphone. FIG. 5 is a schematic block diagram of a microphone circuit 500 with bias compensation in accordance with an embodiment of the invention. In the embodiment depicted in FIG. 5, the microphone circuit 500 includes a single-ended microphone 502. A difference between the microphone circuit 500 depicted in FIG. 5 and the microphone circuit 100 depicted in FIG. 1 is that the microphone circuit 500 includes a bias compensation circuit 546 configured to measure a biasing condition of one OTA of the differential OTA input pair of a sigma-delta ADC circuit 504 of the microphone circuit 500 and to apply the biasing condition of the OTA to another OTA of the differential OTA input pair of the sigma-delta ADC circuit 504. Another difference between the microphone circuit 500 depicted in FIG. 5 and the microphone circuit 100 depicted in FIG. 1 is that the microphone circuit 500 may not include a controller (e.g., the controller 134 depicted in FIG. 1) configured to switch the microphone circuit 500 between different operational modes. The microphone circuit 500 can be used in various applications, such as audio applications, automotive applications, communications applications, and/or consumer or appliance applications. In the embodiment depicted in FIG. 5, the microphone circuit 500 includes the single-ended microphone 502 and the sigma-delta ADC circuit 504. The sigma-delta ADC circuit 504 can convert analog signals from the single-ended microphone 502 into digital information. The microphone circuit 500 can be implemented in at least one substrate, such as a semiconductor wafer. In an embodiment, the microphone circuit 500 or a component of the microphone circuit is packaged as a stand-alone IC chip. For example, the single-ended microphone 502 and the sigma-delta ADC circuit 504 are located on the same IC chip. In some embodiments, the single-ended microphone 502 and the sigma-delta ADC circuit 504 are located in close proximity but in different IC chips. Although the microphone circuit 500 is shown in FIG. 5 as including certain circuit elements, in other embodiments, the microphone circuit may include one or more additional circuit elements. For example, the microphone circuit may include a power supply 506 configured to provide an output signal having a voltage, $V_{MIC}$, to the single-ended microphone 502. In another example, the microphone circuit includes a resistor 508 and capacitors 510, 512 that are connected between the single-ended microphone 502, the sigma-delta ADC circuit 504, and/or the power supply 506.

In the embodiment depicted in FIG. 5, the single-ended microphone 502 is a transducer configured to convert sound into an analog signal, for example, by converting the air pressure variations of a sound wave to an electrical signal. In some embodiments, the single-ended microphone 502 is an ECM or an MEMS Microphone, which has a single-ended output voltage. In some embodiments, a negative input, VinN, which is common mode noise, and a positive input, VinP, which is the combination of the common mode noise and a single-ended output voltage, are inputted into a differential input stage that is formed by OTAs 522, 524. In some embodiments, the single-ended microphone 502 includes an amplifier 514 configured to amplify the analog signal that is generated by the single-ended microphone 502. The amplifier 514 may be implemented as a transistor or other semiconductor device.

In the embodiment depicted in FIG. 5, the sigma-delta ADC circuit 504 converts analog audio signals from the single-ended microphone 502 into a digital output, data_adc. In the embodiment depicted in FIG. 5, the sigma-delta ADC circuit 504 includes the OTAs 522, 524 with transconductance, gm0, gm1, respectively, a filter 526, a quantizer 528, a digital integrator 530, a differential DAC 532, and a bias compensation circuit 546. In an embodiment, the sigma-delta ADC circuit 504 is packaged as a stand-alone IC chip. For example, the OTAs 522, 524, the filter 526, the quantizer 528, the digital integrator 530, the differential DAC 532, and the bias compensation circuit 546 are located on the same IC chip. Although the sigma-delta ADC circuit 504 is shown in FIG. 5 as including certain circuit elements, in other embodiments, the sigma-delta ADC circuit 504 may include more or less circuit elements. For example, the sigma-delta ADC circuit 504 may include a clock source configured to generate a clock signal, clk_adc, for one or more components (e.g., the quantizer 528 and the digital integrator 530) of the sigma-delta ADC circuit 504. In some embodiments, the sigma-delta ADC circuit 504 includes a controller configured to switch the sigma-delta ADC circuit 504 between a single-ended operational mode, a pseudo differential operational mode, and a full differential operational mode, for example, by disabling or deactivating the OTA 522 and/or the OTA 524. The controller may be implemented similarly or the same as the controller 134 depicted in FIG. 1

The sigma-delta ADC circuit 504 depicted in FIG. 5 can provide high integration and low power consumption for audio applications. For example, the sigma-delta ADC circuit 504 can convert analog audio signals from the single-ended microphone 502 into digital output without a pre-amplifier and without drawing significant current from the single-ended microphone 502. In the embodiment depicted in FIG. 5, the OTAs 522, 524 of the sigma-delta ADC circuit 504 form a differential input stage that allows common mode noise from the single-ended microphone 502 to be applied to differential input terminals 536, 538, 540, 542 of the OTAs 522, 524. Consequently, the sigma-delta ADC circuit 504 has better common mode rejection (CMR) performance than a typical single-ended sigma-delta ADC circuit. For example, as depicted in FIG. 5, outputs from the single-ended microphone 502 and feedback signals from the differential DAC 532 are inputted into differential input terminals 536, 538, 540, 542 of the OTAs 522, 524. Specifically, a positive input, VinP, from the capacitor 510 and a positive feedback signal, dacp, from the differential DAC 532 are inputted into positive (non-inverting) and negative (inverting) terminals 536, 538 of the OTA 522. A negative input, VinN, from the capacitor 512 and a negative feedback signal, dacn, from the differential DAC 532 are inputted into positive (non-inverting) and negative (inverting) terminals 540, 542 of the OTA 524. Each of the OTAs 522, 524 may be a single-ended OTA with a single output terminal or a full-differential OTA with two output terminals. Outputs from the OTAs 522, 524 are inputted into the filter 526. The positive feedback signal, dacp, and the negative feedback signal, dacn, from the differential DAC 532 follow the positive output, VinP, and the negative output, VinN. Consequently, the differential signals at the differential input terminals 536, 538, 540, 542 of the OTAs 522, 524 can remain as small as 1 least significant bit (LSB) of the output of the differential DAC 532. The common mode voltage follows the positive input, VinP, and the negative input, VinN, and goes rail-to-rail. Consequently, positive aspects (e.g., high-ohmic input) of a single-ended solution are maintained, while a differential input stage is combined. The OTAs 522, 524 create a low-pass behavior for signal path and shape quantization noise to high frequencies, which can be filtered in a decimation/low-pass digital filter (not shown). In the embodiment depicted in FIG. 5, the negative output, dacn, of the differential DAC 532 is constant and is equal to the input voltage, VinN, at the output of the capacitor 510. In this configuration, Common Mode Rejection (CMR) is improved.

In the embodiment depicted in FIG. 5, the filter 526 is configured to perform signal filtering of the outputs from the OTAs 522, 524 to generate filtered signals, which are inputted into the quantizer 528. In some embodiments, the filter 526 in FIG. 5 is implemented similarly or the same as the filter 226 depicted in FIG. 2.

In the embodiment depicted in FIG. 5, the quantizer 528 is configured to perform a quantization function to the filtered signals from the filter 526 to generate a quantization result. For example, the quantizer 528 may map continuous infinite signal amplitude values (e.g., voltage levels) to a smaller set of discrete finite values. In some embodiments, a time-varying voltage signal is sampled into a discrete-time signal with a sequence of real numbers, and each real number is replaced with an approximation from a finite set of discrete values. In some embodiments, the quantizer 528 is a 1-bit quantizer that has 2 levels. In some embodiments, the quantizer 528 in FIG. 5 is implemented similarly or the same as the quantizer 228 depicted in FIG. 2.

In the embodiment depicted in FIG. 5, the digital integrator 530 is configured to perform an integration function to the quantization result from the quantizer 528 to generate the digital signal, data_adc, which is outputted from the sigma-delta ADC circuit 504. In some embodiments, the quantizer 528 and the digital integrator 530 are operated under the same clock signal, clk_adc, which is generated by a clock source. In some embodiments, the quantizer 528 and the digital integrator 530 form a multi-bit quantizer. In some embodiments, the digital integrator 530 in FIG. 5 is implemented similarly or the same as the digital integrator 230 depicted in FIG. 2.

In the embodiment depicted in FIG. 5, the differential DAC 532 is configured to convert the digital signal, data_adc into a differential analog output having positive and negative analog components, "dacp," and "dacn," which are applied to the OTAs 522, 524. In some embodiments, the differential DAC 532 in FIG. 5 is implemented similarly or the same as the differential DAC 232 depicted in FIG. 2.

In the embodiment depicted in FIG. 5, the bias compensation circuit 546 is configured to measure a biasing condition of the OTA 522 and to apply the biasing condition of the OTA 522 to the OTA 524. By measure the biasing condition of the OTA 522 and applying the biasing condition of the OTA 522 to the OTA 524, Total Harmonic Distortion Plus Noise (THD+N) of the sigma-delta ADC circuit 504 is reduced. In some embodiments, the bias compensation circuit 546 implements a current divert scheme in which the current of a differential pair of transistors in the OTA 522 is measured, for example, using one or more replica differential pairs. In some embodiments, the bias compensation circuit is further configured to measure a current of a first differential pair of transistors of the OTA 522 and to apply the current of the first differential pair of transistors of the OTA 522 to a second differential pair of transistors of the OTA 524. For example, the replica current of one or more differential pairs in the OTA 522 is measured and copied towards one or more differential pairs in the OTA 524. In some embodiments, one or more differential pairs of transistors in the OTA 524 do not go out of saturation, but are compensated with a reduced current similarly as one or more differential pairs of transistors in the OTA 522. In some embodiments, the OTA 522, 524 and the bias compensation circuit are connected to the same bias voltages.

Figure 6:
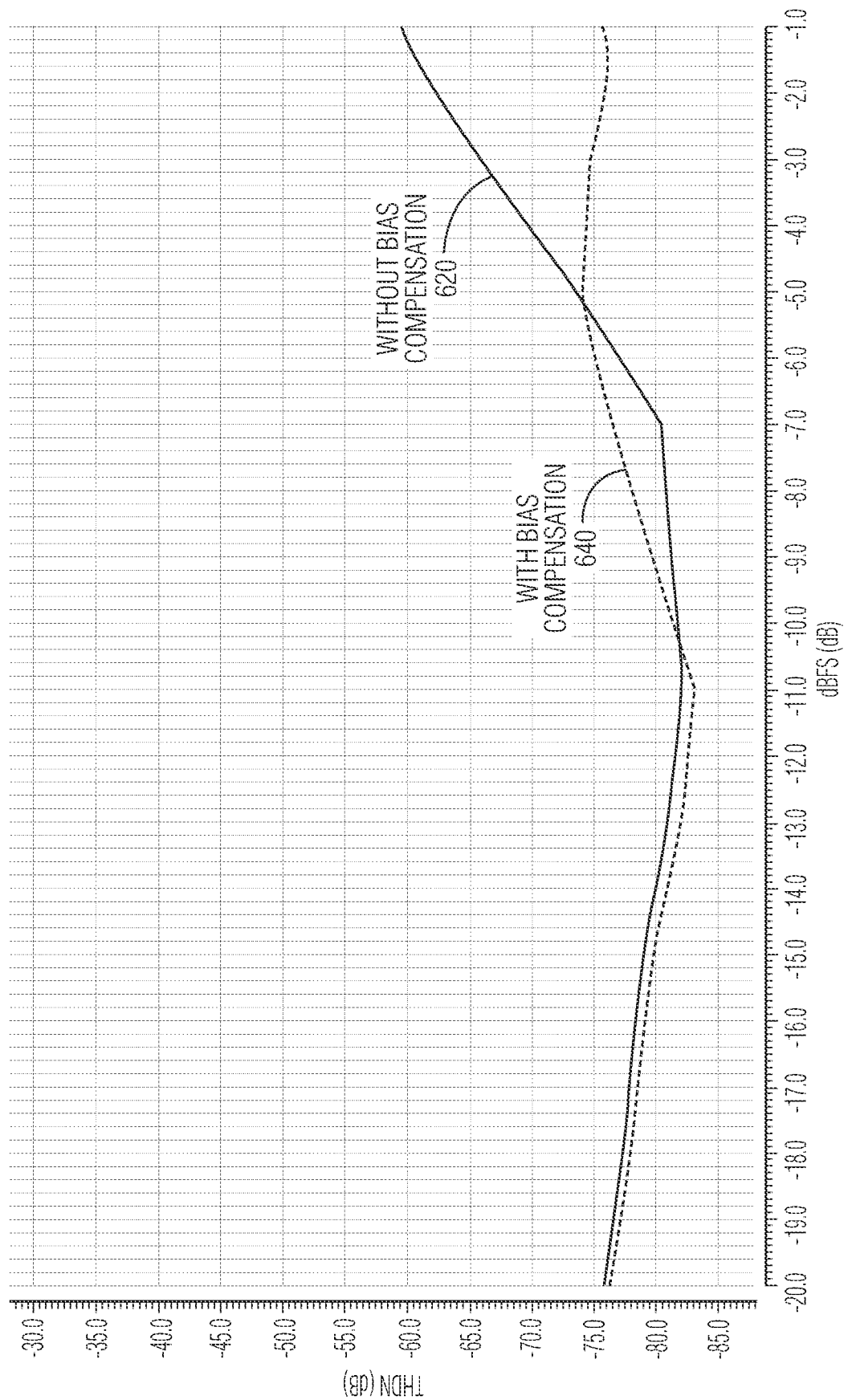
FIG. 6 illustrates example THD+N plots of a sigma-delta ADC circuit of the sigma-delta ADC circuit the microphone circuit depicted in FIG. 6 without bias compensation and with bias compensation.

FIG. 6 illustrates example THD+N plots 620, 640 of the sigma-delta ADC circuit 504 of the microphone circuit 500 depicted in FIG. 5 without bias compensation and with bias compensation. In the examples depicted in FIG. 6, the performance (shown in plot 640) of the sigma-delta ADC circuit 504 with bias compensation stays relatively flat for maximum amplitudes. Compared to the performance (shown in plot 620) of the sigma-delta ADC circuit 504 without bias compensation, the performance (shown in plot 640) of the sigma-delta ADC circuit 504 with bias compensation significantly improves for higher amplitudes (e.g., around −1 dBFS).

Figure 7:
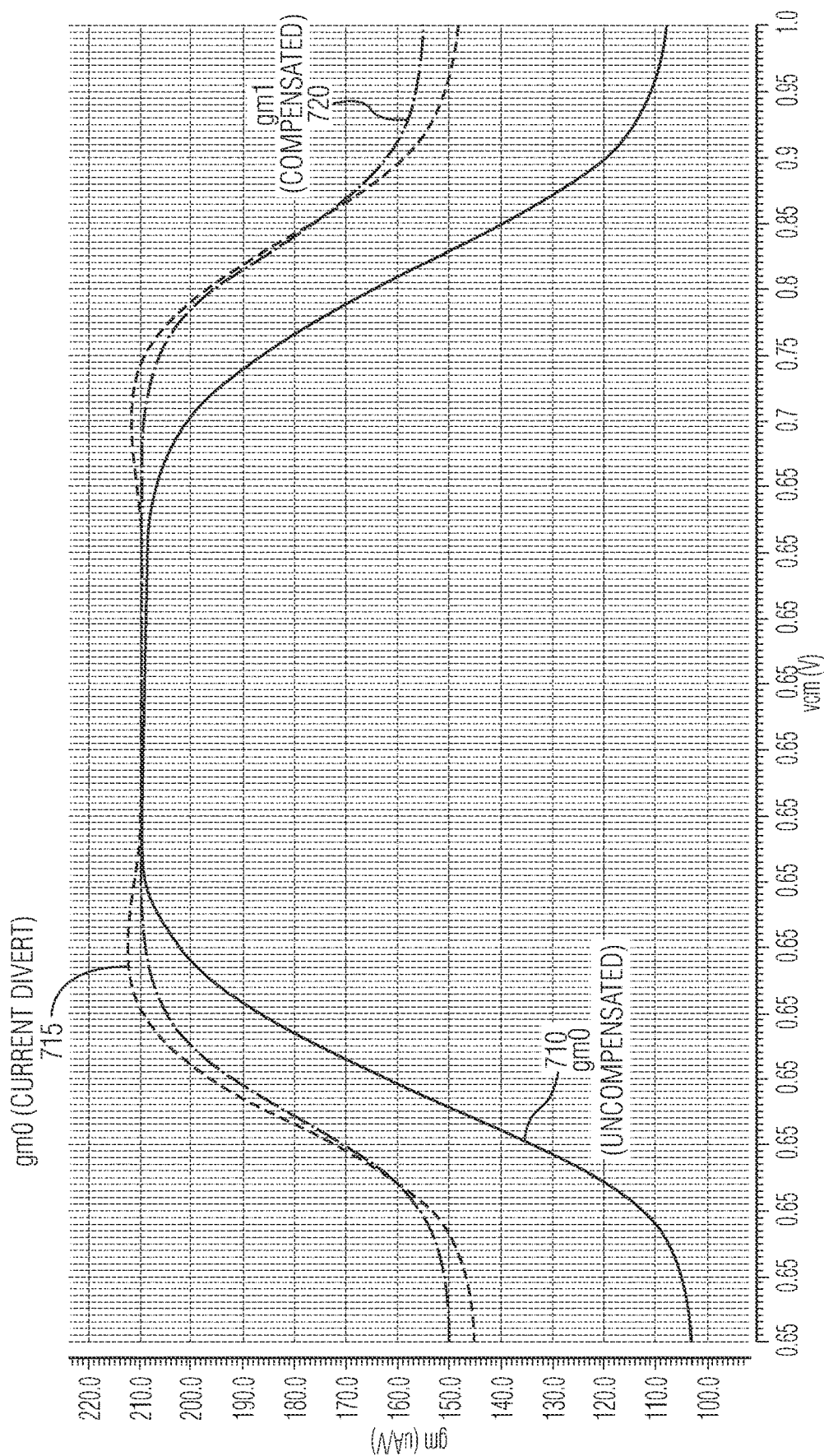
FIG. 7 illustrates example plots of amplifier transconductance versus a common mode input voltage of the sigma-delta ADC circuit of the microphone circuit depicted in FIG. 6.

FIG. 7 illustrates example plots 710, 715, 720 of amplifier transconductance (gm0 and gm1) of the OTA 522, 524 (i.e., gm0 (uncompensated), gm0 (current divert), and gm1 (compensated)) versus common mode input voltage of the sigma-delta ADC circuit 504 of the microphone circuit 500 depicted in FIG. 5. In the examples depicted in FIG. 7, the transconductance (gm0 and gm1) of the OTA 522, 524 are not equal. The bias compensation circuit 546 measures the biasing condition of the OTA 522 and applies the biasing condition of the OTA 522 to the OTA 524. As depicted in FIG. 7, the gm1 (compensated) plot 720 has a similar waveform as the gm0 (uncompensated) plot 710.

Figure 8:
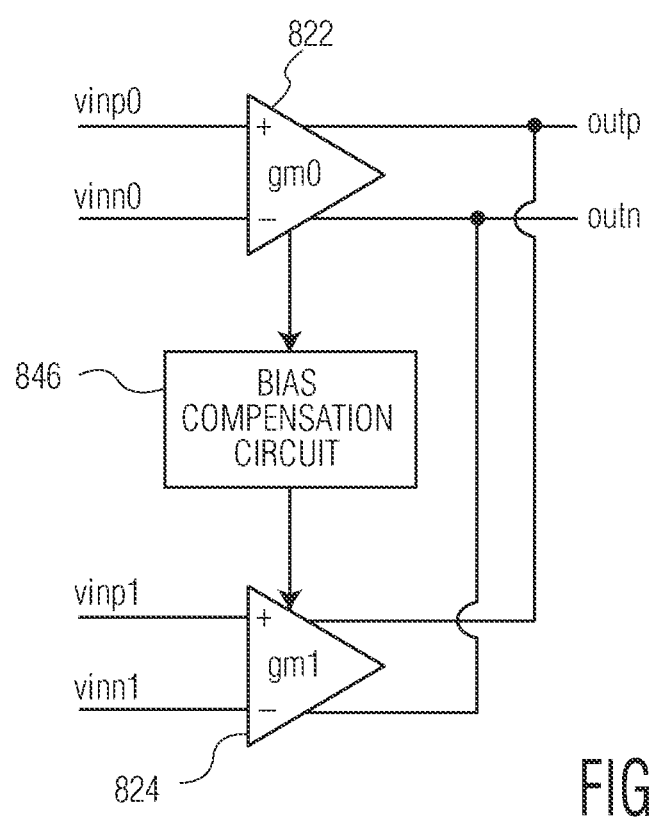
FIG. 8 depicts embodiments of operational transconductance amplifiers (OTAs) and a bias compensation circuit of the sigma-delta ADC circuit depicted in FIG. 6.

FIG. 8 depicts OTAs 822, 824 and a bias compensation circuit 846, which are embodiments of the OTAs 522, 524 and the bias compensation circuit 546 of the sigma-delta ADC circuit 504 depicted in FIG. 5. In the embodiment depicted in FIG. 8, the OTAs 822, 824 with transconductance, gm0, gm1, respectively, are active. Outputs from a single-ended microphone (e.g., the single-ended microphone 502 depicted in FIG. 5) and feedback signals from a corresponding DAC (e.g., the differential DAC 532 depicted in FIG. 5) are inputted into differential input terminals of the OTAs 822, 824. Specifically, a positive input, VinP0, into the sigma-delta ADC circuit 504 and a feedback signal, VinN0, from a corresponding DAC (e.g., the differential DAC 532 depicted in FIG. 5) are inputted into positive (non-inverting) and negative (inverting) terminals of the OTA 822. A feedback signal, VinP1, from a corresponding DAC (e.g., the DAC 532 depicted in FIG. 5) and a negative input, VinN1, into the sigma-delta ADC circuit 504 are inputted into positive (non-inverting) and negative (inverting) terminals of the OTA 824. An output with positive and negative, outp, outn, are outputted from the OTAs 822, 824. In the embodiment depicted in FIG. 8, the output, VinP1, of a corresponding DAC (e.g., the differential DAC 532 depicted in FIG. 5) is constant and is equal to the input voltage, VinN1. In this configuration, Common Mode Rejection (CMR) is improved.

Figure 9A:
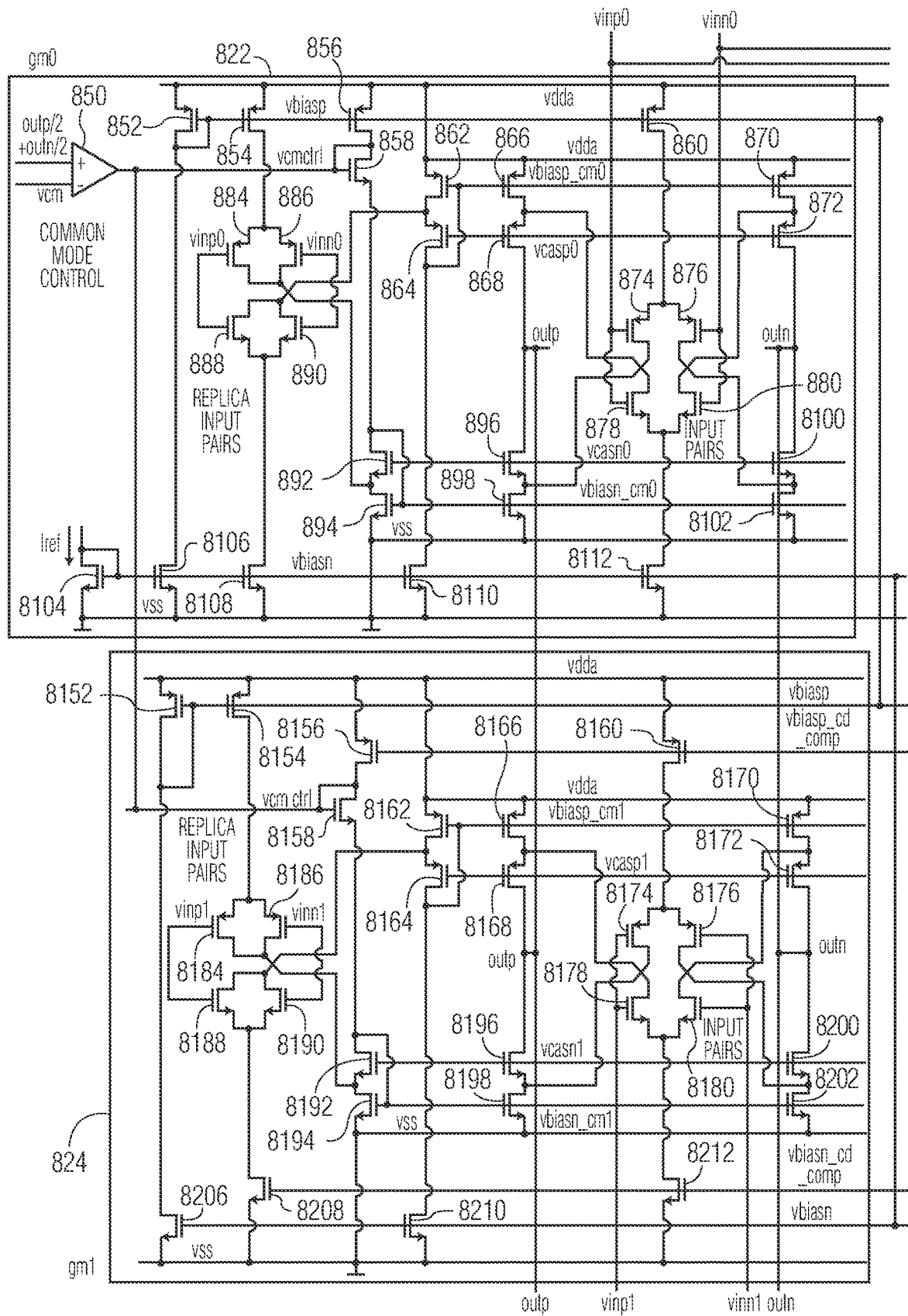
FIG. 9A depicts a detail view of the OTAs depicted in FIG. 8.
Figure 9B:
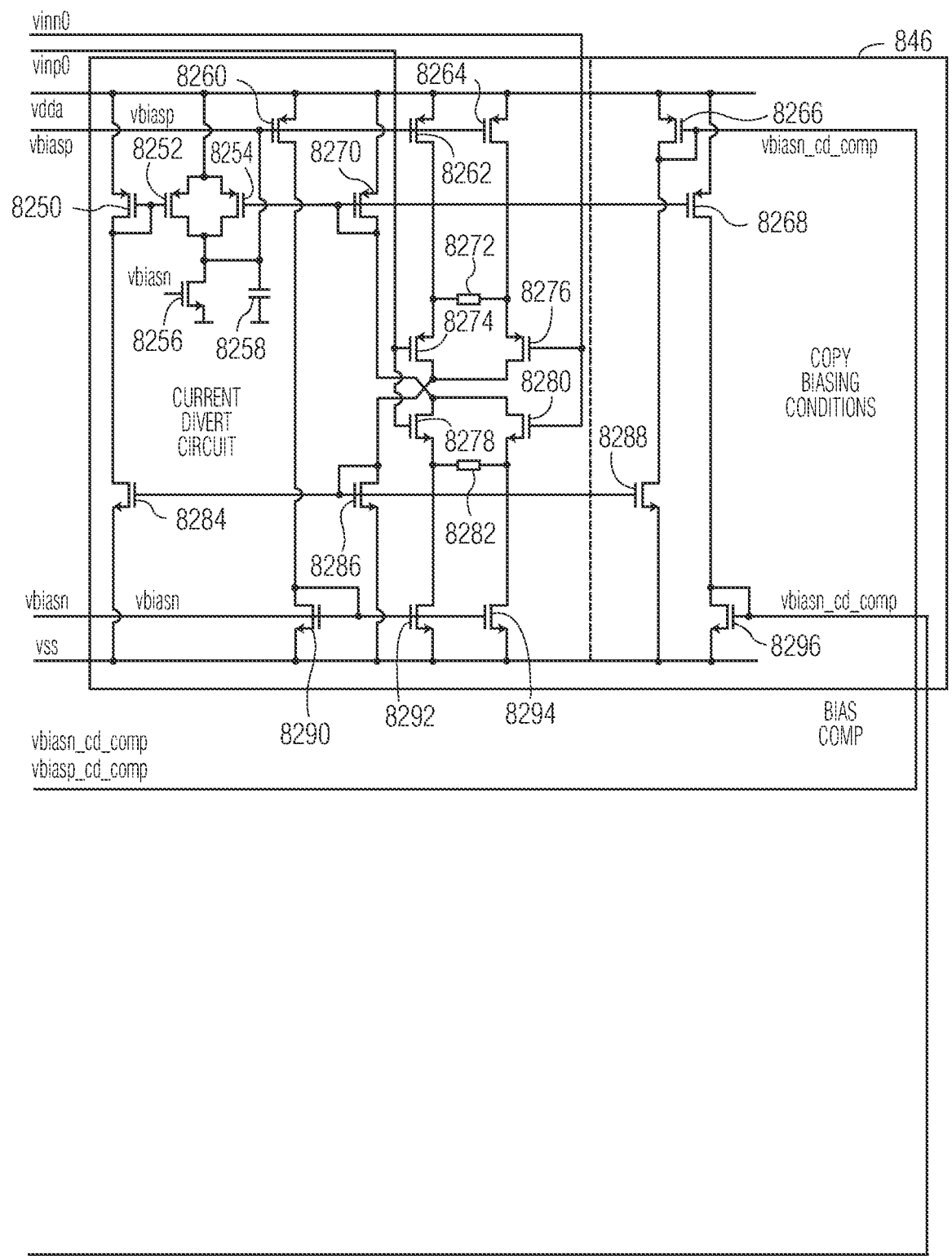
FIG. 9B depicts a detail view of the bias compensation circuit depicted in FIG. 8.

FIG. 9A depicts a detail view of the OTAs 822, 824 depicted in FIG. 8, while FIG. 9B depicts a detail view of the bias compensation circuit 846 depicted in FIG. 8. As depicted in FIGS. 9A and 9B, the OTA 822, 824 and the bias compensation circuit 846 are connected to bias voltages, Vbiasn, Vbiasp.

As depicted in FIG. 9A, the OTA 822 includes a common mode control circuit that is implemented as a comparator 850, current sources formed by P-channel metal-oxidesemiconductor field-effect transistor (MOSFET) (PMOS) and N-channel MOSFET (NMOS) transistors 852, 854, 862, 864, 866, 868, 892, 894, 896, 898, input pairs formed by PMOS and NMOS transistors 874, 876, 878, 880, replica input pairs formed by PMOS and NMOS transistors 884, 886, 888, 890, a current-controlled current source formed by NMOS transistors 8104, 8106, and PMOS and NMOS transistors 856, 858, 860, 870, 872, 8100, 8102, 8108, 8110, 8112.

As depicted in FIG. 9A, the OTA 824 includes current sources formed by PMOS and NMOS transistors 8152, 8154, 8162, 8164, 8166, 8168, 8192, 8194, 8196, 8198, input pairs formed by PMOS and NMOS transistors 8174, 8176, 8178, 8180, replica input pairs formed by PMOS and NMOS transistors 8184, 8186, 8188, 8190, and PMOS and NMOS transistors 8156, 8158, 8160, 8170, 8172, 8200, 8202, 8206, 8208, 8210, 8212.

The bias compensation circuit 846 is configured to measure a biasing condition of the OTA 822 and to apply the biasing condition of the OTA 822 to the OTA 824. As depicted in FIG. 9B, the bias compensation circuit 846 includes current sources formed by PMOS and NMOS transistors 8250, 8252, 8254, 8270, 8256, 8284, 8286, 8274, 8276, 8278, 8280, resistors 8272, a capacitor 8258, and PMOS and NMOS transistors 8260, 8262, 8264, 8266, 8268, 8288, 8290, 8292, 8294, 8296. The bias compensation circuit 846 implements a current divert scheme in which the current of a differential pair of transistors in the OTA 822 is measured using, for example, one or more replica differential pairs. In some embodiments, the bias compensation circuit measures a current of a first set of differential pairs of transistors (e.g., the PMOS transistors 874, 876 forming a differential pair of PMOS transistors, the NMOS transistors, 878, 880 forming a differential pair of NMOS transistors) of the OTA 822, for example, using replica differential pairs of transistors 8274, 8276, 8278, 8280, and to apply the current of the first set of differential pairs of transistors of the OTA 822 to a second set of differential pairs of transistors (e.g., the PMOS transistors 8174, 8176 forming a differential pair of PMOS transistors, the NMOS transistors, 8178, 8180 forming a differential pair of NMOS transistors) of the OTA 824. For example, the current of one or more differential pairs in the OTA 822 is measured and copied towards one or more differential pairs in the OTA 824. In some embodiments, one or more differential pairs of transistors in the OTA 824 do not go out of saturation, but are compensated with a reduced current similarly as one or more differential pairs of transistors in the OTA 822.

Embodiments of the inventions can be applied to various applications, such as audio applications, automotive applications, communications applications, and/or consumer or appliance applications. For example, a sigma-delta ADC circuit in accordance of an embodiment of the invention (e.g., the sigma-delta ADC circuit 104 depicted in FIG. 1, the sigma-delta ADC circuit 204 depicted in FIG. 2, or the sigma-delta ADC circuit 504 depicted in FIG. 5) can be used in audio applications, such as, gaming headsets, Bluetooth hearables, wireless microphones, soundbar applications, hearing aids, earbuds, etc. In some embodiments, a sigma-delta ADC circuit in accordance of an embodiment of the invention (e.g., the sigma-delta ADC circuit 104 depicted in FIG. 1, the sigma-delta ADC circuit 204 depicted in FIG. 2, or the sigma-delta ADC circuit 504 depicted in FIG. 5) is implemented as a system on chip (SoC).

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A multi-mode sigma-delta analog-to-digital converter (ADC) circuit, the multi-mode sigma-delta ADC circuit comprising:
    a pair of operational transconductance amplifiers (OTAs);
    a filter connected to the pair of OTAs;
    a quantizer connected to the filter;
    a differential digital-to-analog converter (DAC) connected to the quantizer, wherein an output of a microphone and a differential output of the differential DAC are inputted into a plurality of input terminals of the pair of OTAs; and
    a controller configured to switch the multi-mode sigma-delta ADC circuit between a single-ended operational mode, a pseudo differential operational mode, and a full differential operational mode to improve common mode rejection (CMR) performance by controlling the pair of OTAs.

2. The multi-mode sigma-delta ADC circuit of claim 1, wherein the microphone is a single-ended microphone.

3. The multi-mode sigma-delta ADC circuit of claim 2, wherein the controller is further configured to operate the multi-mode sigma-delta ADC circuit under the single-ended operational mode.

4. The multi-mode sigma-delta ADC circuit of claim 3, wherein the controller is further configured to disable a first OTA of the pair of OTAs and to enable a second OTA of the pair of OTAs.

5. The multi-mode sigma-delta ADC circuit of claim 2, wherein the controller is further configured to operate the multi-mode sigma-delta ADC circuit under the pseudo differential operational mode.

6. The multi-mode sigma-delta ADC circuit of claim 5, wherein the controller is further configured to enable each OTA of the pair of OTAs.

7. The multi-mode sigma-delta ADC circuit of claim 6, wherein a component of the differential output of the differential DAC is constant.

8. The multi-mode sigma-delta ADC circuit of claim 7, wherein the component of the differential output of the differential DAC is equal to an input voltage to the multi-mode sigma-delta ADC circuit.

9. The multi-mode sigma-delta ADC circuit of claim 1, wherein the microphone is a differential microphone.

10. The multi-mode sigma-delta ADC circuit of claim 9, wherein the controller is further configured to operate the multi-mode sigma-delta ADC circuit under the full differential operational mode.

11. The multi-mode sigma-delta ADC circuit of claim 1, wherein the quantizer comprises a one-bit quantizer and a digital integrator connected to the one-bit quantizer.

12. The multi-mode sigma-delta ADC circuit of claim 11, wherein the one-bit quantizer and the digital integrator are operated under a same clock signal.

13. A multi-mode sigma-delta analog-to-digital converter (ADC) circuit, the multi-mode sigma-delta ADC circuit comprising:
    a pair of operational transconductance amplifiers (OTAs);
    a filter connected to the pair of OTAs;
    a quantizer connected to the filter;
    a differential digital-to-analog converter (DAC) connected to the quantizer, wherein the DAC comprises a plurality of resistors and a plurality of switches connected to the resistors, wherein an output of a microphone and a differential output of the differential DAC are inputted into a plurality of input terminals of the pair of OTAs; and a controller configured to switch the multi-mode sigma-delta ADC circuit between a single-ended operational mode, a pseudo differential operational mode, and a full differential operational mode to improve common mode rejection (CMR) performance by controlling the pair of OTAs.

14. The multi-mode sigma-delta ADC circuit of claim 13, wherein the microphone is a single-ended microphone.

15. The multi-mode sigma-delta ADC circuit of claim 14, wherein the controller is further configured to disable a first OTA of the pair of OTAs and to enable a second OTA of the pair of OTAs under the single-ended operational mode.

16. The multi-mode sigma-delta ADC circuit of claim 13, wherein the controller is further configured to enable each OTA of the pair of OTAs under the pseudo differential operational mode.

17. The multi-mode sigma-delta ADC circuit of claim 16, wherein a component of the differential output of the differential DAC is constant under the pseudo differential operational mode.

18. The multi-mode sigma-delta ADC circuit of claim 13, wherein the microphone is a differential microphone, and wherein the controller is further configured to operate the multi-mode sigma-delta ADC circuit under the full differential operational mode.

19. The multi-mode sigma-delta ADC circuit of claim 13, wherein the quantizer comprises a one-bit quantizer and a digital integrator connected to the one-bit quantizer.

20. A microphone circuit, the microphone circuit comprising:

a microphone; and a multi-mode sigma-delta analog-to-digital converter (ADC) circuit connected to the microphone, the multi-mode sigma-delta ADC circuit comprising:

a pair of operational transconductance amplifiers (OTAs);

a filter connected to the pair of OTAs;

a quantizer connected to the filter;

a differential digital-to-analog converter (DAC) connected to the quantizer, wherein an output of the microphone and a differential output of the differential DAC are inputted into a plurality of input terminals of the pair of OTAs; and a controller configured to switch the multi-mode sigma-delta ADC circuit between a single-ended operational mode, a pseudo differential operational mode, and a full differential operational mode to improve common mode rejection (CMR) performance by controlling the pair of OTAs.

* * * * *